(12) United States Patent
Kawai

(10) Patent No.: US 11,683,922 B2
(45) Date of Patent: Jun. 20, 2023

(54) COMPONENT MOUNTING SYSTEM

(71) Applicant: FUJI CORPORATION, Chiryu (JP)

(72) Inventor: Hidetoshi Kawai, Anjo (JP)

(73) Assignee: FUJI CORPORATION, Chiryu (JP)

(*) Notice: Subject to any disclaimer, the term of this patent is extended or adjusted under 35 U.S.C. 154(b) by 165 days.

(21) Appl. No.: 17/265,738

(22) PCT Filed: Aug. 21, 2018

(86) PCT No.: PCT/JP2018/030794
§ 371 (c)(1),
(2) Date: Feb. 3, 2021

(87) PCT Pub. No.: WO2020/039495
PCT Pub. Date: Feb. 27, 2020

(65) Prior Publication Data
US 2021/0168978 A1 Jun. 3, 2021

(51) Int. Cl.
*H05K 13/08* (2006.01)
*H05K 13/02* (2006.01)

(52) U.S. Cl.
CPC ........... *H05K 13/086* (2018.08); *H05K 13/02* (2013.01)

(58) Field of Classification Search
CPC ............ H05K 13/086; Y10T 29/49132; Y10T 29/53174
See application file for complete search history.

(56) References Cited

U.S. PATENT DOCUMENTS

| 6,996,440 B2 * | 2/2006 | Maenishi .......... H05K 13/0452 |
| | | 700/28 |
| 9,801,317 B2 * | 10/2017 | Kurashina ............ H05K 13/085 |
| 10,299,318 B2 * | 5/2019 | Dalhielm ................. H05B 6/80 |
| 10,820,459 B2 | 10/2020 | Kondo et al. |
| 2016/0174426 A1 | 6/2016 | Kurata |

FOREIGN PATENT DOCUMENTS

| EP | 3 344 027 A1 * | 4/2018 |
| EP | 3 344 027 A1 | 7/2018 |
| JP | 2008-66404 A | 3/2008 |

(Continued)

OTHER PUBLICATIONS

International Search Report dated Nov. 6, 2018 in PCT/JP2018/030794 filed Aug. 21, 2018, 1 page.

*Primary Examiner* — Donghai D Nguyen
(74) *Attorney, Agent, or Firm* — Obion, McClelland, Maier & Neustadt, L.L.P.

(57) ABSTRACT

A component mounting system includes multiple component mounting lines where multiple component mounters and a feeder storage are aligned along a board conveyance direction, a feeder exchange device configured to move along the board conveyance direction to exchange the feeder between the component mounter and the feeder storage of the component mounting line in charge, and a memory device. The feeder exchange device is configured to store an in-process feeder in the feeder storage of the component mounting line in charge, when it is determined, based on production information and feeder information, that there is the in-process feeder that was used in the component mounting line in charge and is scheduled to be used in another component mounting line.

5 Claims, 18 Drawing Sheets

(56) References Cited

FOREIGN PATENT DOCUMENTS

| JP | 2013-145817 A | 7/2013 |
| JP | 2014-86517 A | 5/2014 |
| WO | 2014010084 A1 * | 1/2014 |
| WO | WO 2017/033268 A1 | 3/2017 |
| WO | WO 2018/008148 A1 | 1/2018 |

* cited by examiner

Fig. 8

| PRODUCTION PLAN - Line 1 | | |
|---|---|---|
| TYPE | NUMBER OF PRODUCTION | ORDER OF PRODUCTION |
| BOARD-1 | 500 | 1 |
| BOARD-2 | 1000 | 2 |
| BOARD-3 | 1500 | 3 |
| BOARD-4 | 500 | 4 |
| BOARD-5 | 1000 | 5 |
| BOARD-6 | 1500 | 6 |
| BOARD-7 | 500 | 7 |
| BOARD-8 | 1000 | 8 |
| BOARD-9 | 1500 | 9 |
| BOARD-10 | 500 | 10 |
| PRODUCTION PLAN - Line 2 | | |
| TYPE | NUMBER OF PRODUCTION | ORDER OF PRODUCTION |
| BOARD-11 | 500 | 1 |
| BOARD-12 | 1000 | 2 |
| BOARD-13 | 1500 | 3 |
| BOARD-14 | 500 | 4 |
| BOARD-15 | 1000 | 5 |
| BOARD-16 | 1500 | 6 |
| BOARD-17 | 500 | 7 |
| BOARD-18 | 1000 | 8 |
| BOARD-19 | 1500 | 9 |
| BOARD-20 | 500 | 10 |
| PRODUCTION PLAN - Line 3 | | |

Fig. 10

| NUMBER OF FEEDERS TO BE USED | | | | | |
|---|---|---|---|---|---|
| TYPE | W8 | W12 | W16 | W24 | W32 |
| BOARD-1 | 300 | 20 | 15 | 10 | 5 |
| BOARD-2 | 350 | 10 | 5 | 3 | 1 |
| BOARD-3 | 400 | 15 | 10 | 1 | 1 |
| BOARD-4 | 300 | 20 | 15 | 10 | 5 |
| BOARD-5 | 350 | 10 | 5 | 3 | 1 |
| BOARD-6 | 400 | 15 | 10 | 1 | 1 |
| BOARD-7 | 300 | 20 | 15 | 10 | 5 |
| BOARD-8 | 350 | 10 | 5 | 3 | 1 |
| BOARD-9 | 400 | 15 | 10 | 1 | 1 |
| BOARD-10 | 300 | 20 | 15 | 10 | 5 |
| BOARD-11 | 300 | 20 | 15 | 10 | 5 |
| BOARD-12 | 350 | 10 | 5 | 3 | 1 |
| BOARD-13 | 400 | 15 | 10 | 1 | 1 |
| BOARD-14 | 300 | 20 | 15 | 10 | 5 |
| BOARD-15 | 350 | 10 | 5 | 3 | 1 |
| BOARD-16 | 400 | 15 | 10 | 1 | 1 |
| BOARD-17 | 300 | 20 | 15 | 10 | 5 |
| BOARD-18 | 350 | 10 | 5 | 3 | 1 |
| BOARD-19 | 400 | 15 | 10 | 1 | 1 |
| BOARD-20 | 300 | 20 | 15 | 10 | 5 |

Fig. 11

| NECESSARY COMPONENT INFORMATION | | | | |
|---|---|---|---|---|
| BOARD-1 | | BOARD-2 | | |
| PRODUCT NUMBER | REQUIRED NUMBER | PRODUCT NUMBER | REQUIRED NUMBER | |
| 1001 | 10000 | 1001 | 10000 | |
| 1002 | 15000 | 1002 | 15000 | |
| 1003 | 10000 | 1003 | 10000 | |
| 1004 | 15000 | 1004 | 15000 | |
| 1005 | 5000 | 1205 | 5000 | |
| · | | · | | |
| · | | · | | |
| · | | · | | |
| 1495 | 800 | 1595 | 800 | |
| 1496 | 800 | 1596 | 800 | |
| 1497 | 400 | 1697 | 400 | |
| 1498 | 200 | 1698 | 200 | |
| 1499 | 800 | 1899 | 800 | |
| 1500 | 400 | 1900 | 400 | |

Fig. 12

| COMPONENT INFORMATION | | | | |
|---|---|---|---|---|
| PRODUCT NUMBER | S/N | REMAINING NUMBER OF COMPONENTS | LIFE | LOCATION |
| 1001 | 101 | 10000 | 100 | WAREHOUSE |
| 1002 | 200 | 15000 | 100 | WAREHOUSE |
| 1003 | 1500 | 10000 | 100 | WAREHOUSE |
| 1004 | 500 | 15000 | 100 | WAREHOUSE |
| 1005 | 1000 | 5000 | 100 | WAREHOUSE |
| | | | | |
| 1495 | 299 | 453 | 40 | Line1M20Aslot001 |
| 1496 | 394 | 904 | 30 | Line1M20Aslot002 |
| 1497 | 274 | 350 | 90 | Line1M20Aslot003 |
| 1498 | 381 | 342 | 60 | Line1M20Aslot004 |
| 1499 | 287 | 853 | 20 | Line1M20Aslot005 |
| 1500 | 261 | 555 | 10 | Line1M20Aslot006 |

Fig. 13

| STORAGE AREA INFORMATION |||||||| 
|---|---|---|---|---|---|---|---|
| POSITION INFORMATION |||| FEEDER INFORMATION ||||
| LINE NO. | MODULE NO. | SLOT NO. | UP/DOWN | FEEDER ID | TYPE OF COMPONENT | NUMBER OF COMPONENT | FULL |
| Line1 | 20A | 001 | UP | AAA | A-001 | 4000 | FULL |
| Line1 | 20A | 001 | DOWN | AAD | A-004 | 3000 | |
| Line1 | 20A | 002 | UP | AAB | A-002 | 4000 | FULL |
| Line1 | 20A | 002 | DOWN | – | – | – | |
| Line1 | 20A | 003 | UP | AAC | A-003 | 3500 | |
| | | | | | | | |
| Line1 | 20B | 005 | UP | ABA | B-010 | 2500 | |
| Line1 | 20B | 005 | DOWN | ABC | B-020 | 2000 | FULL |
| | | | | | | | |
| Line2 | 20C | 010 | UP | ACA | C-030 | 1500 | |
| Line2 | 20C | 010 | DOWN | ACB | C-035 | 1800 | |
| | | | | | | | |
| Line3 | 20A | 020 | UP | – | – | – | |
| Line3 | 20A | 020 | DOWN | – | – | – | |
| | | | | | | | |

COMPONENT MOUNTING SYSTEM

TECHNICAL FIELD

The present specification discloses a component mounting system.

BACKGROUND ART

Conventionally, as a component mounting system of this type, a system is proposed, such as including a component mounting line in which multiple component mounters and a feeder storage are aligned in the board conveyance direction, and an exchange robot that can move along the board conveyance direction and exchange the feeders between the feeder storage and each component mounter (for example, refer to Patent Literature 1). The exchange robot unloads the necessary feeders from the feeders stored in the feeder storage and replenishes the feeders to each component mounter in the component mounting line. The replenishment and the collection of the feeders to the feeder storage is performed by a manual operation by an operator, and also performed by conveying the feeders in and out from the outside of the line to the feeder storage by an automatic guided vehicle (AGV) or an overhead hoist transport (OHT).

PATENT LITERATURE

Patent Literature 1: WO2017/033268

BRIEF SUMMARY

Technical Problem

However, in a component mounting system provided with multiple component mounting lines, in some case, there may be a feeder (in-process feeder) that was used in one component mounting line and is scheduled to be used in another component mounting line. In this case, the operator needs to temporarily collect the feeder used in one component mounting line to the outside of the line and puts the feeder in a warehouse, find out the necessary feeder from the warehouse when changing the setup of other component mounting line, and then, replenish the feeder to the feeder storage of other component mounting line, and thus, there is a problem in that the operation becomes complicated. In addition, even when replenishing and collecting the feeder to the feeder storage using the AGV or the OHT, since the operation by the operator in the warehouse is required to be performed for each feeder, the load to the operator is not reduced that much.

The main object of the present disclosure is to change the setup of each component mounting line in a component mounting system provided with multiple component mounting lines can be performed more efficiently.

Solution to Problem

The present disclosure has taken following means to achieve the main object described above.

A component mounting system according to the present disclosure includes: multiple component mounting lines where multiple component mounters that can mount components supplied from a feeder on a board and a feeder storage are aligned along a board conveyance direction; a feeder exchange device that is provided on each of the multiple component mounting lines and configured to move along the board conveyance direction to exchange the feeder between the component mounter and the feeder storage of the component mounting line in charge; and a memory device configured to store production information including a type of board used for production for each component mounting line, a type of component to be mounted on the board, and an order of production, and store feeder information including identification information of the feeder, a location of the feeder, and a type of component to be loaded on the feeder, and the feeder exchange device is configured to store an in-process feeder in the feeder storage of the component mounting line in charge when it is determined, based on the production information and the feeder information, that there is the in-process feeder that was used in the component mounting line in charge and is scheduled to be used in another component mounting line.

The component mounting system in the present disclosure is provided with the feeder exchange device in each of the multiple component mounting lines where multiple component mounters and feeder storage machines are aligned in the board conveyance direction. When it is determined, based on the production information and the feeder information, that there is an in-process feeder that was used in the component mounting line in charge and scheduled to be used in another component mounting line, the feeder exchange device stores the in-process feeder in the feeder storage of the component mounting line in charge. In this way, since the in-process feeders can be collected from the feeder storage collectively, it becomes possible to change the setup of each component mounting line more efficiently.

BRIEF DESCRIPTION OF DRAWINGS

FIG. 8 is an explanatory diagram illustrating an example of a production plan of each line 1 to 3.

FIG. 10 is an explanatory diagram illustrating an example of the number of feeders to be used for each board.

FIG. 11 is an explanatory diagram illustrating an example of necessary component information for each board.

FIG. 12 is an explanatory diagram illustrating an example of the component information.

FIG. 13 is an explanatory diagram illustrating an example of storage area information.

DESCRIPTION OF EMBODIMENTS

Next, an embodiment for the present disclosure will be described with reference to the drawings.

Figure 1:
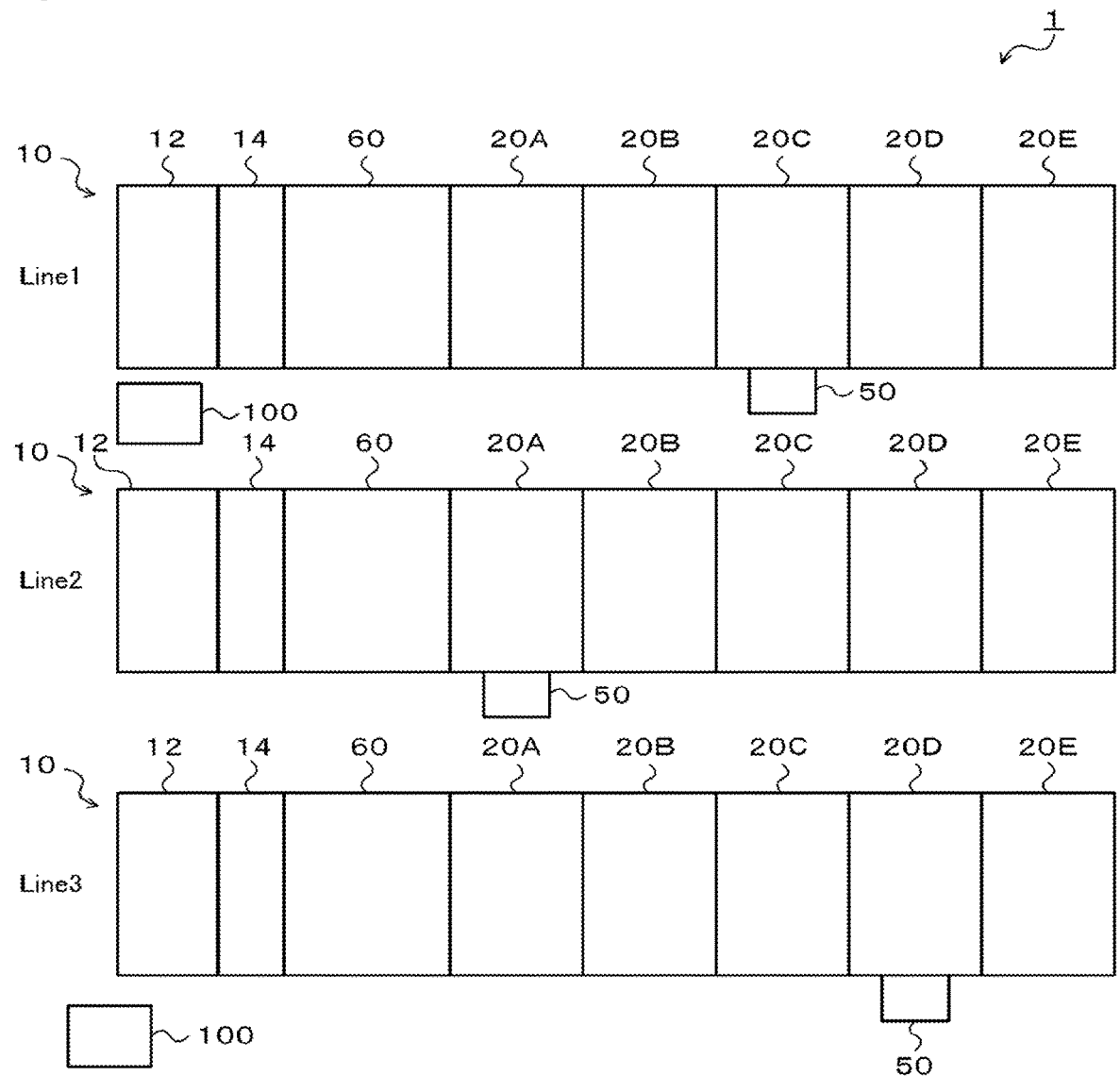
FIG. 1 is a schematic diagram schematically illustrating component mounting system 1 including multiple component mounting lines 10 (lines 1 to 3).
Figure 2:
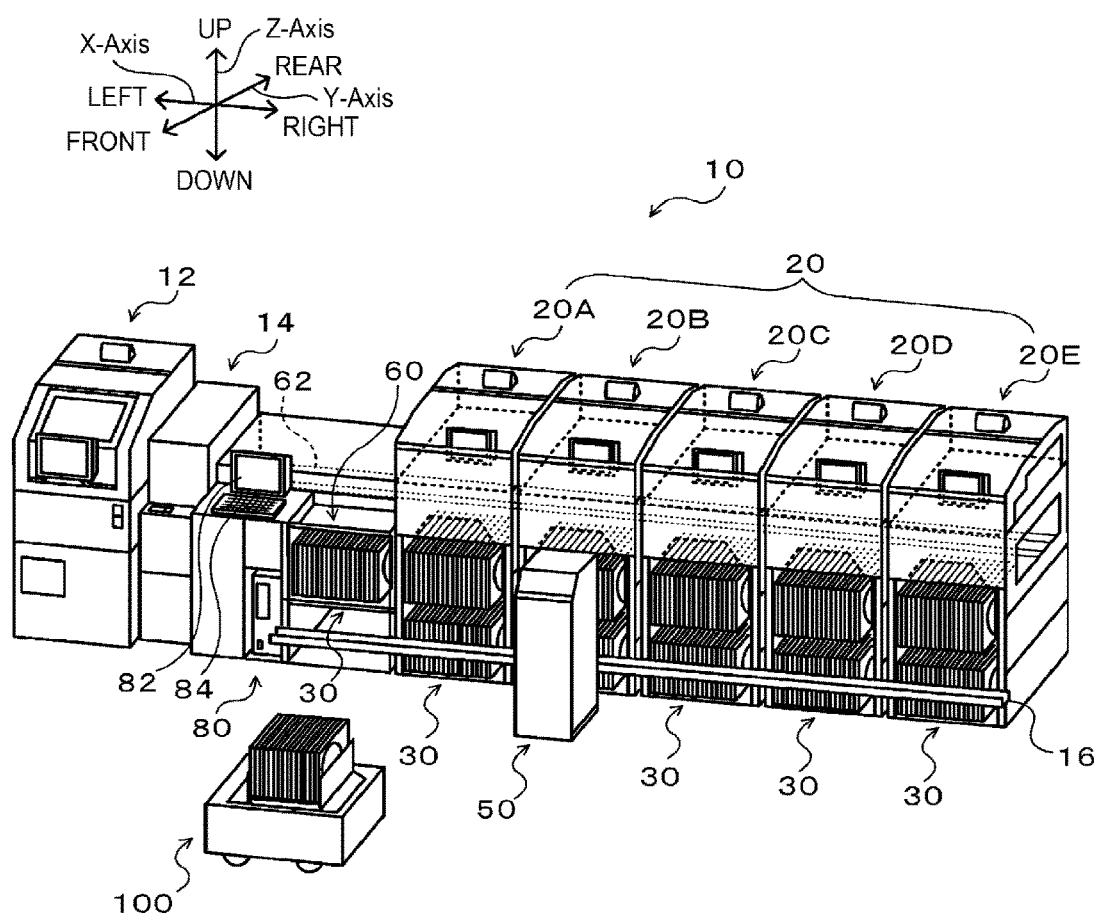
FIG. 2 is a schematic configuration view of component mounting line 10.
Figure 3:
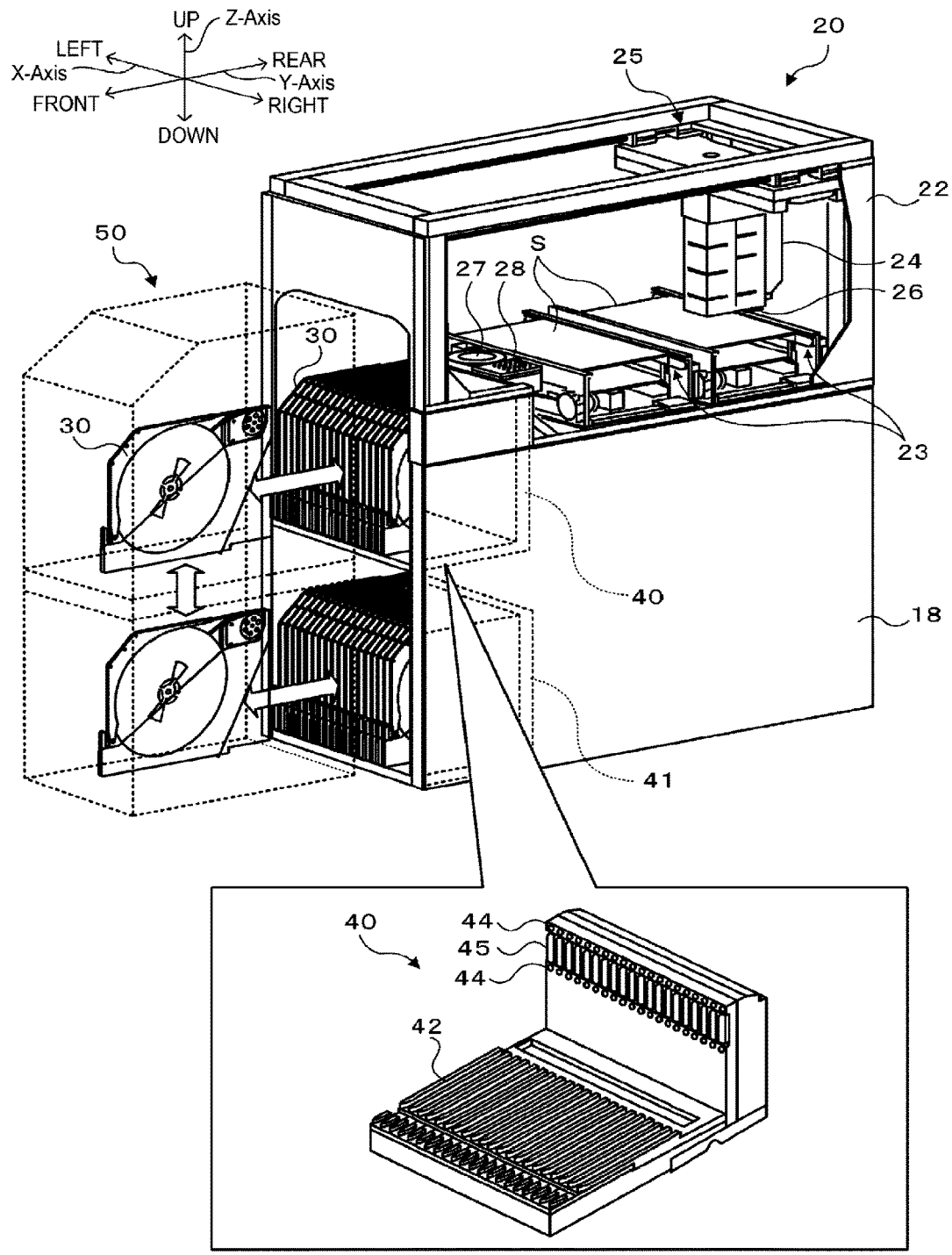
FIG. 3 is a schematic configuration view of component mounter 20.
Figure 4:
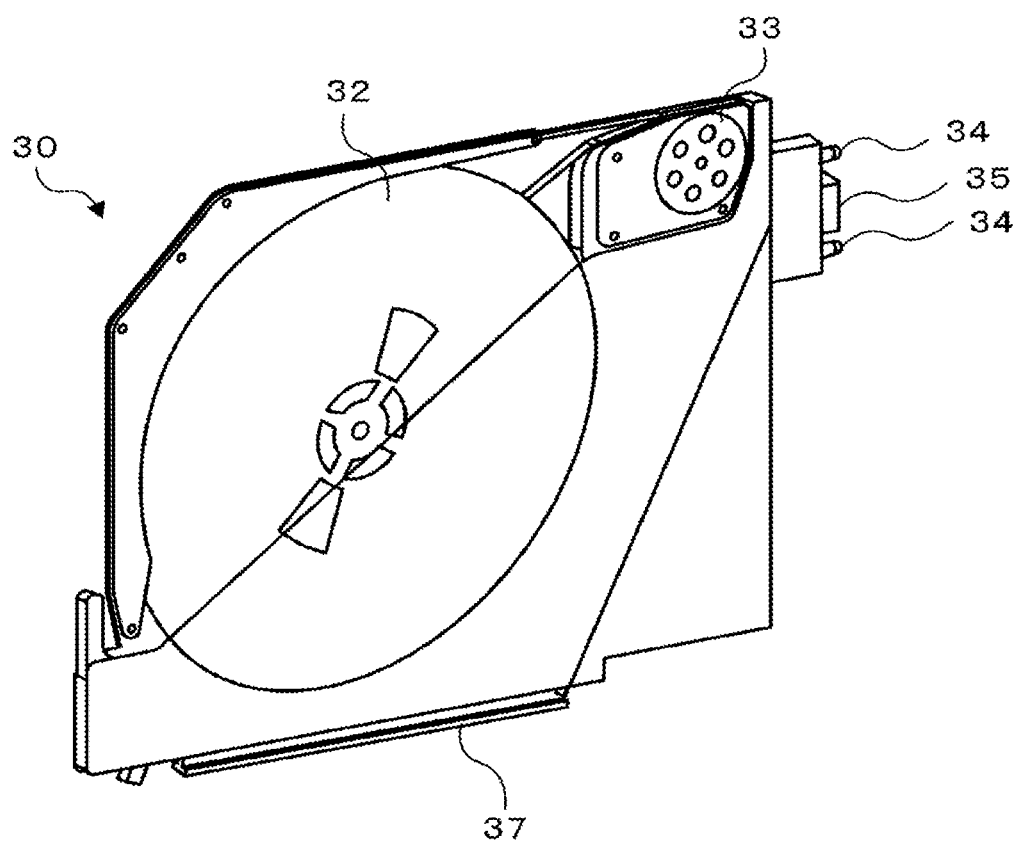
FIG. 4 is a schematic configuration view of feeder 30.
Figure 5:
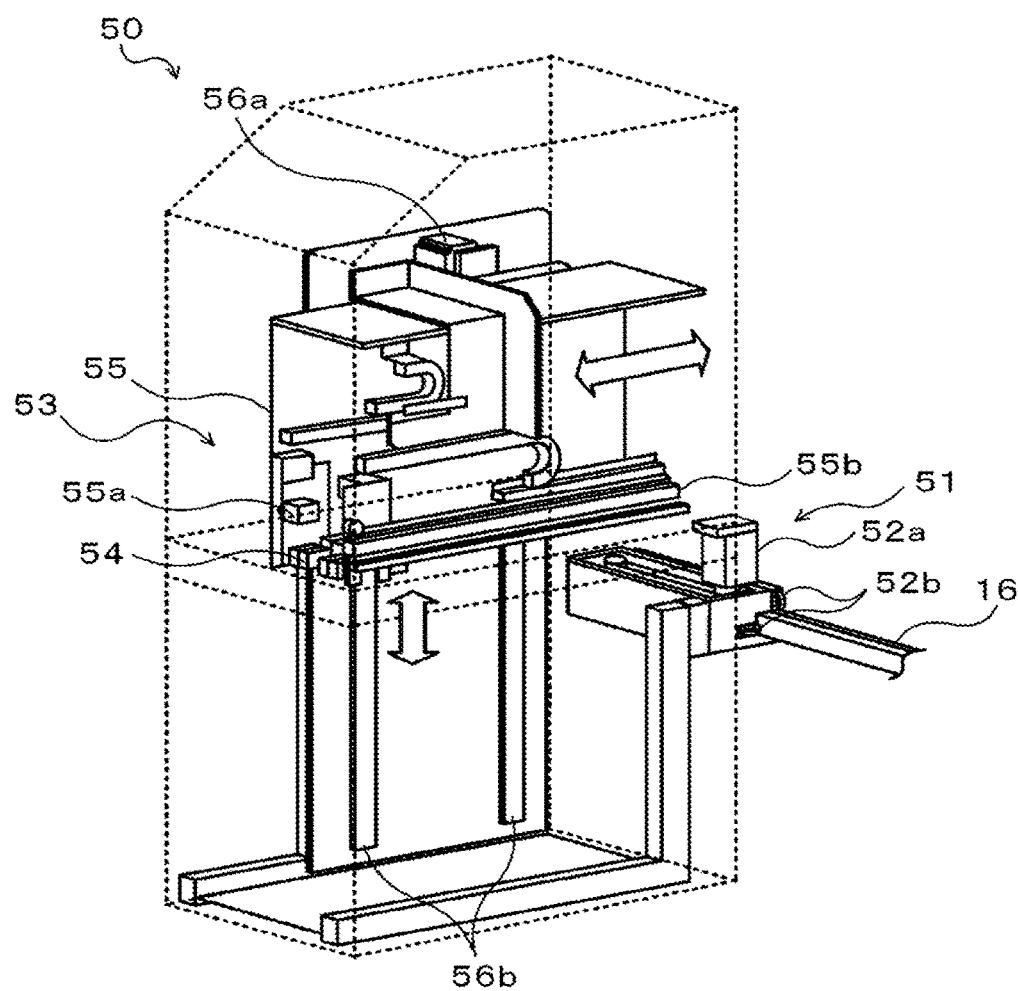
FIG. 5 is a schematic configuration view of feeder exchange robot 50.
Figure 6:
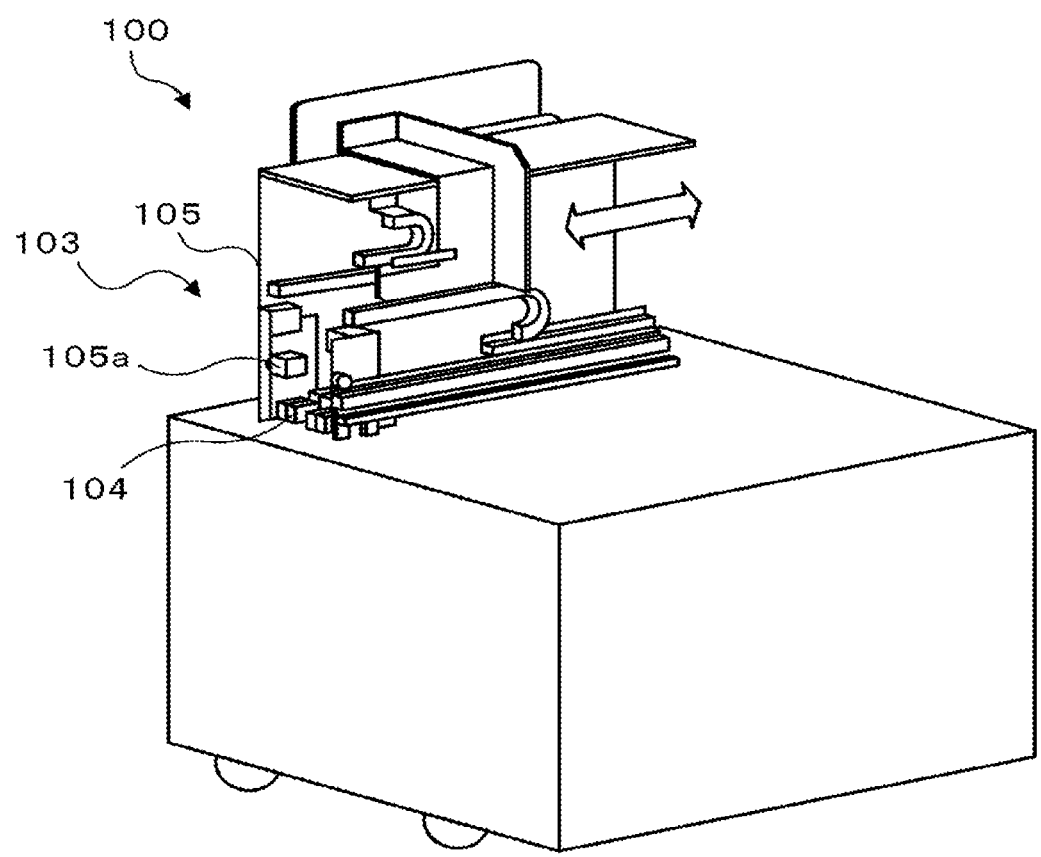
FIG. 6 is a schematic configuration view of automatic guided vehicle 100.
Figure 7:
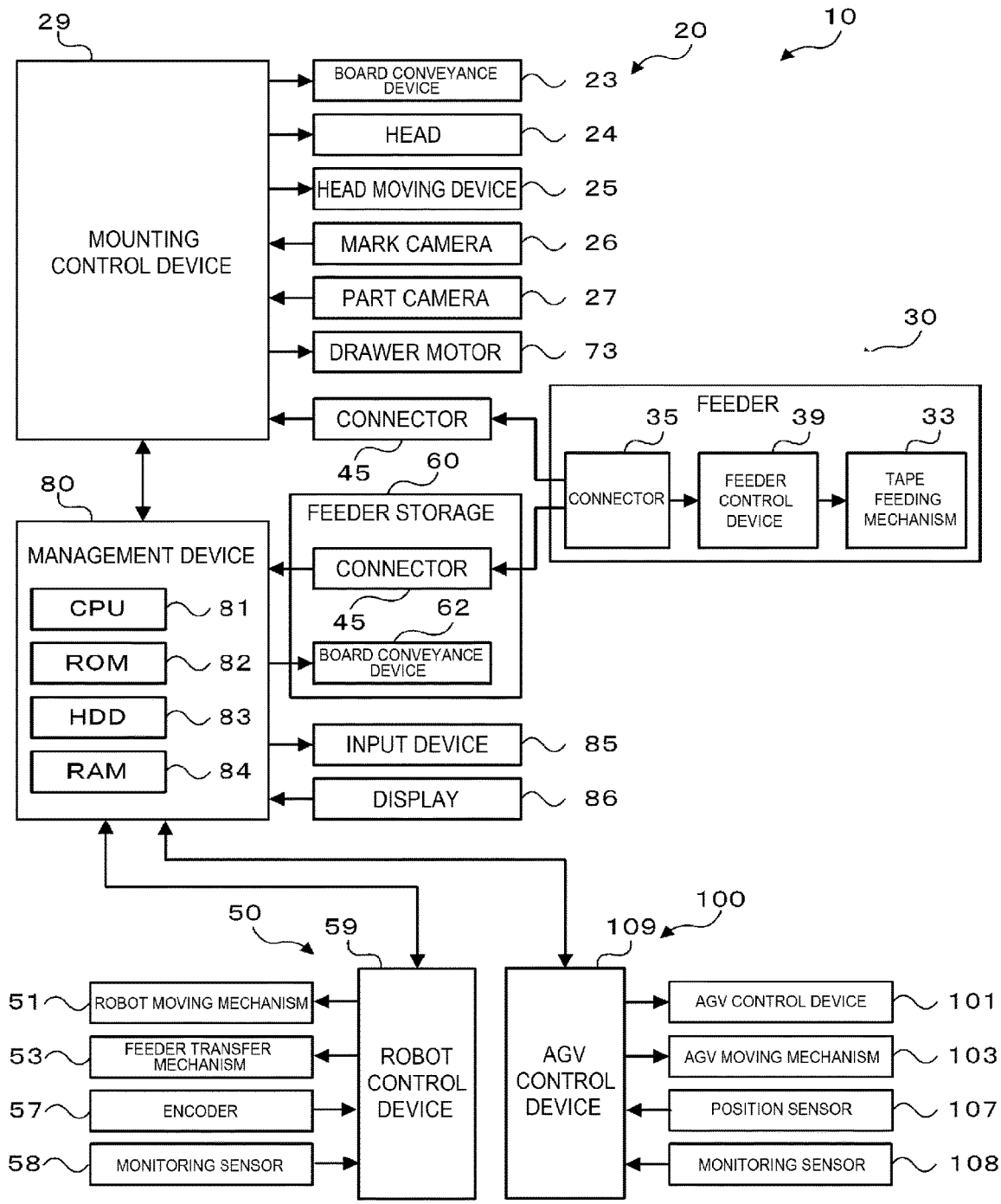
FIG. 7 is an explanatory diagram illustrating an electrical connection relationship between mounting control device 29, robot control device 59, management device 80, and AGV control device 109.

FIG. 1 is a schematic diagram schematically illustrating component mounting system 1 including multiple component mounting lines 10 (lines 1 to 3). FIG. 2 is a schematic configuration diagram of component mounting line 10. FIG. 3 is a schematic configuration diagram of component mounter 20. FIG. 4 is a schematic configuration diagram of feeder 30. FIG. 5 is a schematic configuration diagram of feeder exchange robot 50. FIG. 6 is a schematic configuration diagram of automatic guided vehicle 100. FIG. 7 is an explanatory diagram illustrating an electrical connection relationship between mounting control device 29, robot control device 59, management device 80, and AGV control device 109. The lateral direction in FIGS. 1 and 3 is the X-direction, the longitudinal direction is the Y-direction, and the vertical direction is the Z-direction.

As illustrated in FIG. 1, component mounting system 1 includes multiple (for example, three) component mounting lines 10 (also referred to as lines 1 to 3) and automatic guided vehicle (also referred to as an AGV) 100 that moves between each line to convey feeder 30. As illustrated in FIG. 2, each component mounting line 10 includes printer 12, printing inspector 14, multiple component mounters 20 (20A to 20E), mounting inspector (not illustrated), feeder exchange robot 50, and feeder storage 60. In addition, as illustrated in FIG. 2, any one of the multiple component mounting lines 10 (lines 1 to 3) also includes management device 80 that manages the entire system. In the present embodiment, only one management device 80 is provided the multiple component mounting lines 10, but one management device 80 may be provided for each of the multiple component mounting lines 10.

Printer 12 prints solder on board S. Printing inspector 14 inspects the state of the solder printed by printer 12. Component mounter 20 is aligned along the conveyance direction (X-direction) of board S, picks up (pickup by suction) the components supplied by feeder 30, and mounts the components on board S. The printing inspector inspects the mounting state of the components mounted by component mounter 20. Feeder exchange robot 50 replenishes necessary feeder 30 to multiple component mounters 20 and collects used feeder 30 from component mounter 20. Feeder storage 60 can store feeder 30 scheduled to be used by component mounter 20 and used feeder 30. Printer 12, printing inspector 14, and multiple component mounters 20 are arranged in the conveyance direction of board S side by side in this order to configure component mounting line 10. In addition, among multiple component mounters 20A to 20E of component mounting line 10, feeder storage 60 is installed between component mounter 20A and printing inspector 14 at the most upstream in the board conveyance direction. Among multiple component mounters 20A to 20E, feeder storage 60 may be arranged so as to be adjacent to the downstream of component mounter 20E at the most downstream in the board conveyance direction. In addition, multiple feeder storages 60 may be arranged on one component mounting line 10.

As illustrated in FIG. 3, component mounters 20 (20A to 20E) include board conveyance device 23 that conveys board S from left to right, head 24 including a suction nozzle that picks up the components supplied by feeder 30, head moving mechanism 25 that moves head 24 to the longitudinal direction and the lateral direction (XY-direction), and mounting control device 29 that controls the entire device (refer to FIG. 7). In addition, component mounter 20 includes mark camera 26, part camera 27, nozzle station 28, and the like. Mark camera 26 is attached to head 24 and images a reference mark affixed to board S from above. Part camera 27 is installed between feeder 30 and board conveyance device 23, and images the components from below when the suction nozzle that picked up the components passes above part camera 27. Nozzle station 28 accommodates multiple types of suction nozzles so as can be exchanged according to the type of component to be picked up. Mounting control device 29 is configured with well-known CPU, ROM, RAM, and the like. Image signals from mark camera 26 and part camera 27 are input to mounting control device 29. Mounting control device 29 recognizes the position of board S by processing the image of board S captured by mark camera 26 and recognizing the position of the board mark (not illustrated) affixed to board S. In addition, mounting control device 29 determines a suction position and a suction posture of the component based on the image captured by part camera 27. On the other hand, mounting control device 29 outputs a drive signal to board conveyance device 23, head 24, head moving mechanism 25, and the like. Mounting control device 29 performs a suction operation to control head 24 and head moving mechanism 25 such that the components supplied by feeder 30 are picked up by suction to the suction nozzle. In addition, mounting control device 29 performs a mounting operation to control head 24 and head moving mechanism 25 such that the components picked up to the suction nozzle are mounted on the board S.

As illustrated in FIG. 4, feeder 30 includes tape reel 32, tape feeding mechanism 33, connector 35, rail member 37, and feeder control device 39 (refer to FIG. 7). A tape is wound around tape reel 32. The tape has multiple recess portions formed at a predetermined interval along the longitudinal direction. Each recess portion accommodates a component. These components are protected by a film that covers the surface of the tape. Tape feeding mechanism 33 feeds the tape from tape reel 32. The feeder 30 drives tape feeding mechanism 33 to feed the tape rearward by a predetermined amount, so that the components accommodated in the tape are sequentially supplied to a component supply position. The components accommodated in the tape are in a state of being exposed at the component supply position by peeling the film before the component supply position, and are picked up by the suction nozzle. Connector 35 has two positioning pins 34 protruding in the attaching direction. Rail member 37 is provided at the lower end of feeder 30 and extends in the attaching direction. Feeder control device 39 is configured with a well-known CPU, ROM, RAM, and the like, and outputs a drive signal to tape feeding mechanism 33. In addition, feeder control device 39 can communicate with a control unit (mounting control device 29, feeder storage 60, and the like) to which feeder 30 is loaded via connector 35.

As illustrated in FIG. 3, feeder 30 is detachably loaded to feeder bases 40 and 41 provided in upper and lower two stages in front of component mounter 20. Feeder base 40 at the upper stage is a feeder base in the component supply area that can supply the components from mounted feeder 30, and feeder base 41 at the lower stage is a feeder base of a stock area that can stock feeder 30. Multiple feeder bases 40 and 41 are arranged in the X-direction, and feeders 30 are loaded so as to line up in the X-direction. Feeder bases 40 and 41 are L-shaped base in a side view, and include slot 42, two positioning holes 44, and connector 45. Rail member 37 of feeder 30 is inserted into slot 42. Two positioning pins 34 of feeder 30 are inserted into two positioning holes 44, and feeder 30 is positioned at feeder base 40. Connector 45 is provided between two positioning holes 44, and connector 35 of feeder 30 is connected to connector 45.

The feeder exchange robot 50 is movable along X-axis rail 16 provided parallel to the conveyance direction (X-axis direction) of the board on the front surface of multiple component mounters 20 (20A to 20E) and the front surface of feeder storage 60. In FIG. 3, the illustration of X-axis rail 16 is omitted.

As illustrated in FIG. 5, feeder exchange robot 50 includes robot moving mechanism 51 (refer to FIG. 7), feeder transfer mechanism 53, encoder 57 (refer to FIG. 7), monitoring sensor 58 (refer to FIG. 7), and robot control device 59 (refer to FIG. 7). Robot moving mechanism 51 moves the robot main body along X-axis rail 16, and includes X-axis motor 52a such as a servomotor that drives a driving belt, and guide roller 52b that guides the movement of feeder exchange robot 50 along X-axis rail 16. Feeder transfer mechanism 53 transfers feeder 30 to component mounter 20 and feeder storage 60. Feeder transfer mechanism 53 includes clamp section 54 that clamp feeder 30, Y-axis slider 55 that moves clamp section 54 along Y-axis guide rail 55b, and Z-axis motor 56a that moves Y-axis slider 55 in the vertical direction (Z-direction) along Z-axis guide rail 56 together with clamp section 54. Y-axis slider 55 includes Y-axis motor 55a, and moves clamp section 54 in the longitudinal direction (Y-axis direction) by driving Y-axis motor 55a. Encoder 57 detects the movement position of feeder exchange robot 50 in the X-direction. Monitoring sensor 58 monitors the presence or absence of an interfering object (operator) using, for example, a laser scanner or the like. Robot control device 59 is configured with a well-known CPU, ROM, RAM, and the like, inputs a detection signal from encoder 57 and monitoring sensor 58, and outputs a drive signal to robot moving mechanism 51 (X-axis motor 52a) and feeder transfer mechanism 53 (clamp section 54, Y-axis motor 55a and Z-axis motor 56a).

Y-axis slider 55 of feeder transfer mechanism 53 moves between the upper position facing feeder base 40 at the upper stage of component mounter 20 and the lower position facing feeder base 41 at the lower stage. Robot control device 59 clamps feeder 30 accommodated in feeder exchange robot 50 to clamp section 54, and moves Y-axis slider 55 to the upper stage using Z-axis motor 56a. Then, robot control device 59 pushes out clamp section 54 in the Y-direction (rearward) using Y-axis motor 55a, and causes feeder 30 to be loaded to feeder base 40 at the upper stage of component mounter 20 by releasing the clamp of feeder 30 using clamp section 54. In addition, robot control device 59 clamps feeder 30 that is loaded to feeder base 40 at the upper stage to clamp section 54, and causes feeder 30 to be unloaded from feeder base 40 by pulling clamp section 54 into the Y-direction (forward) using Y-axis motor 55a, and then, and collects feeder 30 in feeder exchange robot 50. Loading of feeder 30 to feeder base 41 at the lower stage of component mounter 20, or unloading of feeder 30 from feeder base 41 at the lower stage, are the same process as loading of feeder 30 to feeder base 40 at the upper stage and unloading of feeder 30 from feeder base 40 at the upper stage except such a point that Y-axis slider 55 is moved to the lower stage using Z-axis motor 56a, and therefore, the description will be omitted.

In feeder storage 60, a feeder base having the same configuration as feeder bases 40 and 41 of component mounter 20 is provided at the same height (Z-direction position) as feeder base 40 at the upper stage. Therefore, feeder exchange robot 50 can load and unload feeder 30 to and unloaded from the feeder base of feeder storage 60 at the position facing feeder storage 60 by performing the same operation as the loading and unloading of feeder 30 to feeder base 40 at the upper stage of component mounter 20

In addition, behind feeder storage 60, a board conveyance device 62 for conveying board S in the X-direction is provided. This board conveyance device 62 is installed at the same position as the board conveyance device (not illustrated) of printing inspector 14 and board conveyance device 23 of adjacent component mounter 20 in the longitudinal direction and the vertical direction. Therefore, board conveyance device 62 can receive board S from the board conveyance device of printing inspector 14, and can convey the received board S to deliver to board conveyance device 23 of adjacent component mounter 20.

AGV 100 replenishes feeder 30 loading the components necessary for production to feeder storage 60 provided in each line and collects used feeder 30 from feeder storage 60 while moving between the lines of multiple component mounting lines 10 (lines 1 to 3) and between the warehouse (not illustrated) and the line that stores a large number of feeders 30. Only one AGV 100 may be provided in component mounting system 1, or multiple AGVs 100 may be provided. As illustrated in FIG. 6, AGV 100 includes AGV moving mechanism 101 (refer to FIG. 7), feeder transfer mechanism 103, position sensor 107 (refer to FIG. 7), monitoring sensor 108 (refer to FIG. 7), and AGV control device. 109 (refer to FIG. 7). AGV moving mechanism 101 travels the AGV main body along a rail (not illustrated) provided on the floor such that the lines of multiple component mounting lines 10 are connected to each other or such that the lines and the warehouse are connected to each other, and includes a servomotor (not illustrated) that drives wheels on the rail. Feeder transfer mechanism 103 transfers feeder 30 to feeder storage 60 of each line. Feeder transfer mechanism 103 includes clamp section 104 that clamps feeder 30, and Y-axis slider 105 that moves clamp section 104 along Y-axis guide rail 105b. Y-axis slider 105 includes Y-axis motor 105a, and moves clamp section 104 in the longitudinal direction (Y-axis direction) by driving Y-axis motor 105a. Position sensor 107 detects a traveling position of AGV 100. Monitoring sensor 108 monitors the presence or absence of an interfering object (operator) by, for example, a laser scanner or the like. AGV control device 109 is configured with a well-known CPU, ROM, RAM, and the like, inputs a detection signal from position sensor 107 or monitoring sensor 108, and outputs a drive signal to AGV moving mechanism 101 (servomotor) and feeder transfer mechanism 103 (clamp section 104 and Y-axis motor 105a).

Feeder transfer mechanism 103 of AGV 100 is configured in the same manner as feeder transfer mechanism 53 of feeder exchange robot 50 except a point that it does not include Z-axis guide rail 56 or Z-axis motor 56a. Therefore, AGV 100 can load and unload feeder 30 to and from the feeder base of feeder storage 60 at a position facing feeder storage 60 of each line, by the same operation as the loading and unloading of feeder 30 to feeder base 40 at the upper stage of component mounter 20.

Figure 9:
FIG. 9 is an explanatory diagram illustrating an example of a production schedule of each line 1 to 3.

As illustrated in FIG. 7, management device 80 is a general-purpose computer configured with CPU 81, ROM 82, HDD 83, RAM 84, and the like, inputs a signal from input device 85 operated by the operator, outputs an image signal to the display 86, and outputs a drive signal to board conveyance device 62 that conveys board S. In HDD 83 of management device 80, a production plan, a production schedule, the number of feeders to be used, necessary component information, component information, and the like are stored. FIG. 8 is an explanatory diagram illustrating an example of the production plan. FIG. 9 is an explanatory diagram illustrating an example of the production schedule. FIG. 10 is an explanatory diagram illustrating an example of the number of feeders to be used. FIG. 11 is an explanatory diagram illustrating an example of the necessary component information. FIG. 12 is an explanatory diagram illustrating an example of the component information. As illustrated in FIG. 8, in the production plan, the type of board S to be produced (mounted), an order of production, and the number of boards to be produced are defined for each component mounting line 10 (lines 1 to 3). As illustrated in FIG. 9, in the production schedule, a preparation time (an area indicated by hatching in the drawing) and a production time (an area indicated by black in the drawing) when producing board S, are defined for each component mounting line 10 (lines 1 to 3) and each board. The number of feeders to be used is the number of feeders 30 to be used for supplying the components necessary for the production of board S in each component mounter 20. As illustrated in FIG. 10, the number of feeders to be used is defined for each board S, such as the type and number of feeders 30 required for loading the components necessary for the production of board S. The necessary component information is information relating to the components necessary for the production of board S. As illustrated in FIG. 11, the necessary component information includes the type (product number) and the number (required number) of the components for each board S. The component information is information relating to the component used for the production of board S. As illustrated in FIG. 12, in the component information, the serial number (S/N), the remaining number of components, the life, the location, and the like are defined for each component type (product number). The remaining number of components indicates the remaining number of components loaded on feeder 30 at the location. The life is an expiration date of the component loaded on feeder 30, and in the example in the drawing, the smaller the number, the less the expiration date remains. The "location" indicates a location of feeder 30 on which the corresponding components re-loaded. For example, in FIG. 12, "Lin1M20A slot001" indicates that a component corresponding to feeder 30 mounted to the slot number 001 of component mounter 20A of line1 is loaded. Management device 80 is communicably connected to mounting control device 29 by wire and is communicably connected to robot control device 59 and AGV control device 109 wirelessly, and receives information relating to the mounting status of component mounter 20 from mounting control device 29, receives information relating to the traveling status of feeder exchange robot 50 from robot control device 59, and receives information on the traveling status of AGV 100 from AGV control device 109. In addition, management device 80 is also communicably connected to the control device of each printer 12, printing inspector 14, and the mounting inspector, and receives various information from the each of those devices.

Management device 80 also manages feeder storage 60 provided in each of multiple component mounting lines 10 (lines 1 to 3). Management device 80 is communicably connected to feeder control device 39 of feeder 30 loaded to the feeder base of feeder storage 60 via connector 35. HDD 83 of management device 80 also stores storage area information including position information and feeder information. An example of the storage area information is illustrated in FIG. 13. The position information is information on a slot number of the slot, component mounter 20 (feeder storage 60), component mounting line 10, to which the corresponding feeder 30 is mounted. The position information includes identification information (line number) of component mounting line 10, identification information (module number) of component mounter 20 (feeder storage 60), the slot number, and upper/lower information. The upper/lower information is information on whether corresponding feeder 30 is at feeder base 40 at the upper stage or at feeder base 41 at the lower stage when feeder 30 is at component mounter 20. In addition, the feeder information includes the identification information (feeder ID) of feeder 30, the type of component to be loaded (component type), the number of components, and FULL information (information on whether tape reel 32 that loads the component is unused). Management device 80 updates the storage information to the latest information when feeder 30 is detached from component mounter 20 or feeder storage 60, or when new feeder 30 is loaded to component mounter 20 or feeder storage 60.

Figure 14:
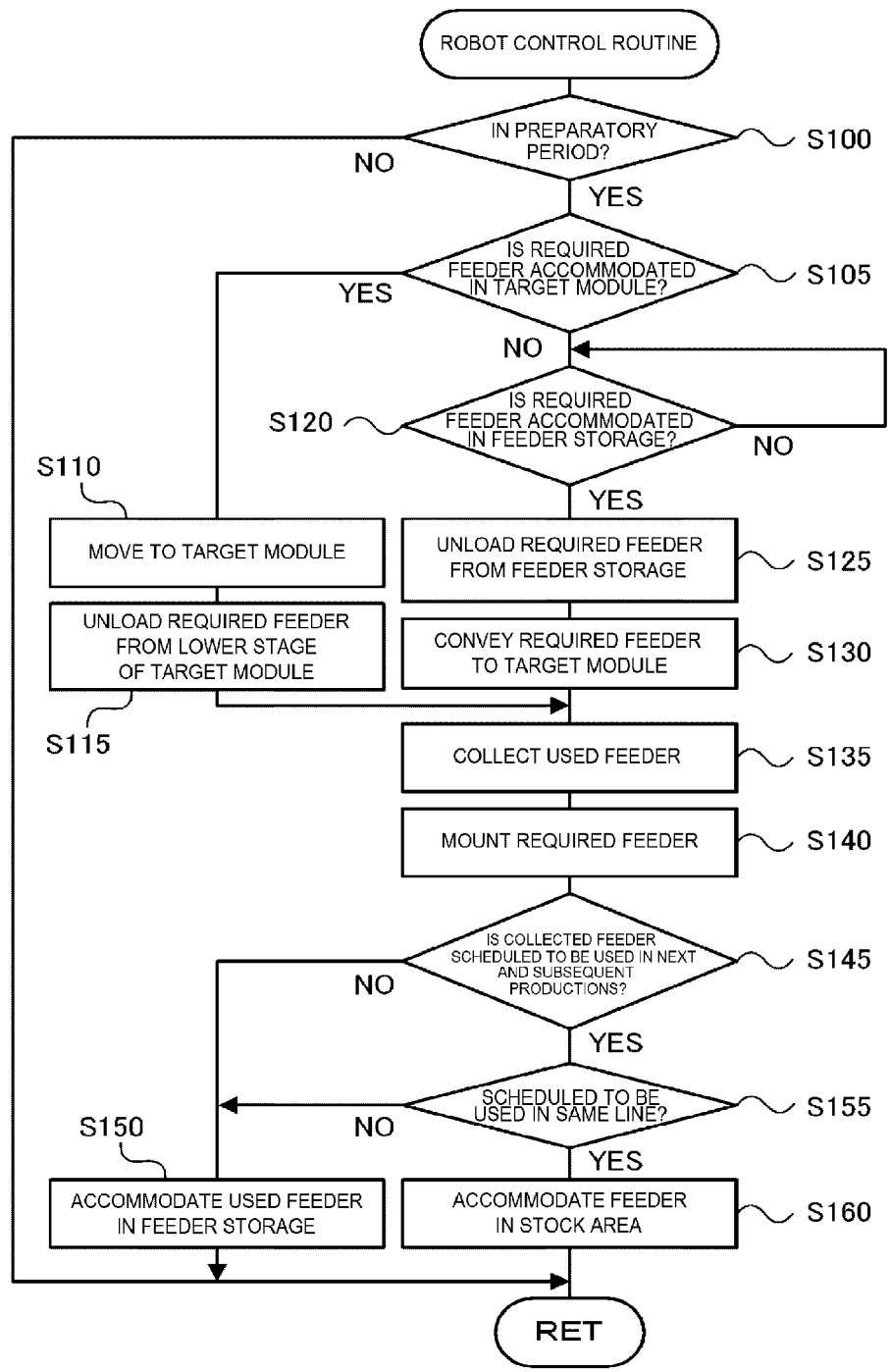
FIG. 14 is a flowchart illustrating an example of a robot control routine.
Figure 15:
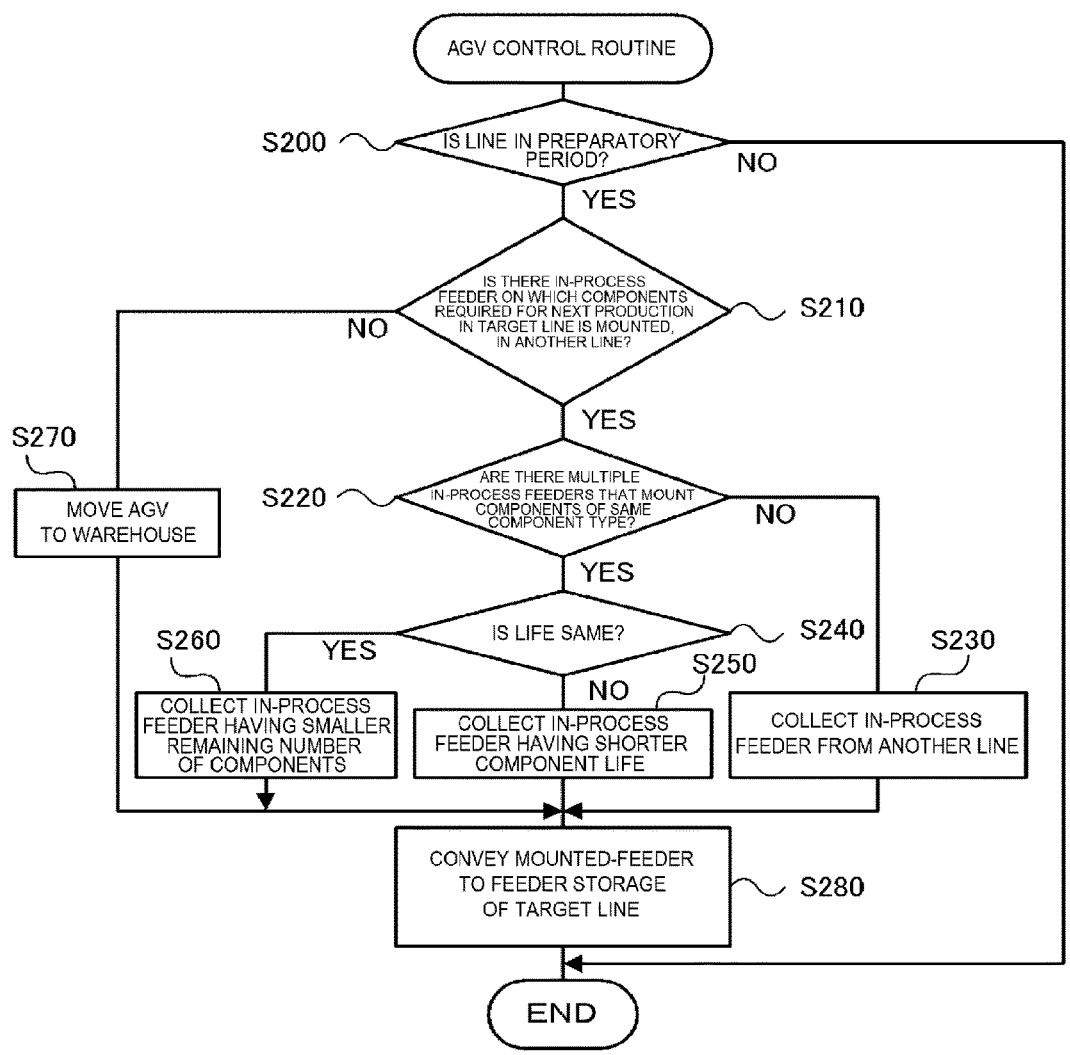
FIG. 15 is a flowchart illustrating an example of an AGV control routine.

The operation of component mounting system 1 configured in this way will be described. In particular, the operation of feeder exchange robot 50 and the operation of AGV 100 during a preparatory period will be described. FIG. 14 is a flowchart illustrating an example of a robot control routine executed by robot control device 59. FIG. 15 is a flowchart illustrating an example of an AGV control routine executed by AGV control device 109. These routines are executed when management device 80 instructs robot control device 59 and the AGV control device 109 to perform the operation. Robot control device 59 and AGV control device 109 receive the production plan, the production schedule, the storage area information, and the like from management device 80 as appropriate.

When the robot control routine is executed, firstly, robot control device 59 determines whether any of the multiple component mounting lines 10 included in component mounting system 1 is in the preparatory period (STEP S100). When it is determined that any of the lines is not in the preparatory period, robot control device 59 ends the robot control routine. On the other hand, when it is determined that any one of the lines is in the preparatory period, robot control device 59 determines whether feeder 30 (required feeder) that loads the component required for the next production for the target module is accommodated in the stock area (feeder base 41 at the lower stage) of component mounter 20 (target module) in the line in the preparatory period (STEP S105). This determination can be performed by acquiring the storage area information described above from management device 80. When it is determined that the required feeder is accommodated in the stock area of the target module, robot control device 59 controls robot moving mechanism 51 to move to the target module (STEP S110), and controls feeder transfer mechanism 53 such that the required feeder is unloaded from target module (STEP S115). On the other hand, when it is determined that the required feeder is not accommodated in the stock area of the target module, robot control device 59 determines whether the required feeder is accommodated in feeder storage 60 in the line in the preparatory period (STEP S120). This determination can be performed by acquiring the storage area information described above from management device 80. When it is determined that the required feeder is not accommodated in feeder storage 60, robot control device 59 waits for the accommodation of the required feeder in feeder storage 60. On the other hand, when it is determined that the required feeder is accommodated in feeder storage 60, robot control device 59 controls robot moving mechanism 51 and feeder transfer mechanism 53 such that the required feeder is unloaded from feeder storage 60 by moving to feeder storage 60 (STEP S125), and controls robot moving mechanism 51 such that the unloaded required-feeder is convey to the target module (STEP S130).

Next, robot control device 59 controls robot moving mechanism 51 and feeder transfer mechanism 53 so as to collect the used feeder accommodated in the target module (STEP S135). Then, robot control device 59 controls robot moving mechanism 51 and feeder transfer mechanism 53 such that the required feeder is loaded to the target module (STEP S140).

Next, robot control device 59 determines whether the collected used feeder is a feeder (in-process feeder) scheduled to be used in the next and subsequent productions (STEP S145). This determination can be performed by acquiring the production plan, the necessary component information, and the storage area information from management device 80. When it is determined that collected used feeder is not scheduled to be used in the next and subsequent productions, robot control device 59 controls robot moving mechanism 51 and feeder transfer mechanism 53 so as to store the used feeder in feeder storage 60 (STEP S150), and ends the robot control routine. On the other hand, when it is determined that the collected used feeder is an in-process feeder that is scheduled to be used in the next and subsequent productions, robot control device 59 further determines whether the in-process feeder is scheduled to be used in the same line (STEP S155). When it is determined to be used in the same line, robot control device 59 controls feeder transfer mechanism 53 (STEP S160) such that the in-process feeder is accommodated in the stock area of the target module, and ends the robot control routine. When it is not determined to be used in the same line but to be used in another line, robot control device 59 controls robot moving mechanism 51 and feeder transfer mechanism 53 such that the in-process feeder is accommodated in feeder storage 60 (STEP S150), and ends the robot control routine.

Next, the AGV control routine will be described. When the AGV control routine is executed, firstly, AGV control device 109 determines whether any of multiple component mounting lines 10 included in component mounting system 1 is in the preparatory period (STEP S200). When it is determined that any of the line is not in the preparatory period, AGV control device 109 ends the AGV control routine. On the other hand, when it is determined that any of the line is in the preparatory period, AGV control device 109 determines whether there is a feeder (in-process feeder) that loads the components required for the next production in the target line in the preparatory period, in another line (STEP S210). This determination can be performed by acquiring the storage area information from management device 80. When it is determined that the in-process feeder is in another line, AGV control device 109 determines whether there are multiple in-process feeders that load components of the same component type (STEP S220). When it is determined that there is only one in-process feeder that loads the components of the same component type, AGV control device 109 collects the corresponding in-process feeder (STEP S230). As described above, when the in-process feeder is used in the line, the feeder is accommodated to feeder storage 60 in the line by feeder exchange robot 50. Therefore, in STEP S230, AGV control device 109 controls AGV moving mechanism 101 and feeder transfer mechanism 103 so as to move to feeder storage 60 in the line where there is the in-process feeder and unload the in-process feeder from feeder storage 60. On the other hand, when it is determined that there multiple in-process feeders that load the components of the same component type, AGV control device 109 determines whether the life (expiration date) of the components loaded on the multiple in-process feeders is the same (STEP S240). When it is determined that the life of the components is not the same, AGV control device 109 collects the in-process feeder having the shorter life of the component, that is, the feeder having the smaller remaining expiration date (STEP S250). In this way, by preferentially using the component having the smaller remaining expiration date, it is possible to suppress the occurrence of the components of which the expiration date is expired, and avoid the unnecessary disposal of the components. When it is determined that the life of the components is the same, AGV control device 109 collects the in-process feeder having the smaller remaining number of components (STEP S260). In this way, it is possible to suppress the production efficiency from deteriorating due to the occurrence of large amount of feeders (tape reels) currently being in use.

When it is determined in STEP S200 that there is a line in the preparatory period and determined in STEP S210 that there is not the in-process feeder in another line, AGV control device 109 controls AGV moving mechanism 101 to move the AGV to the warehouse (STEP S270). In this way, when AGV 100 is moved to the warehouse, the operator waiting in the warehouse loads a new feeder that loads the components required for the next production, on AGV 100.

When the required feeder is loaded on AGV 100 in this way, AGV control device 109 controls AGV moving mechanism 101 and feeder transfer mechanism 103 so as to convey the required feeder to feeder storage 60 of the target line and accommodate the feeder in feeder storage 60 (STEP S280), and then, ends the AGV control routine.

Figure 16:
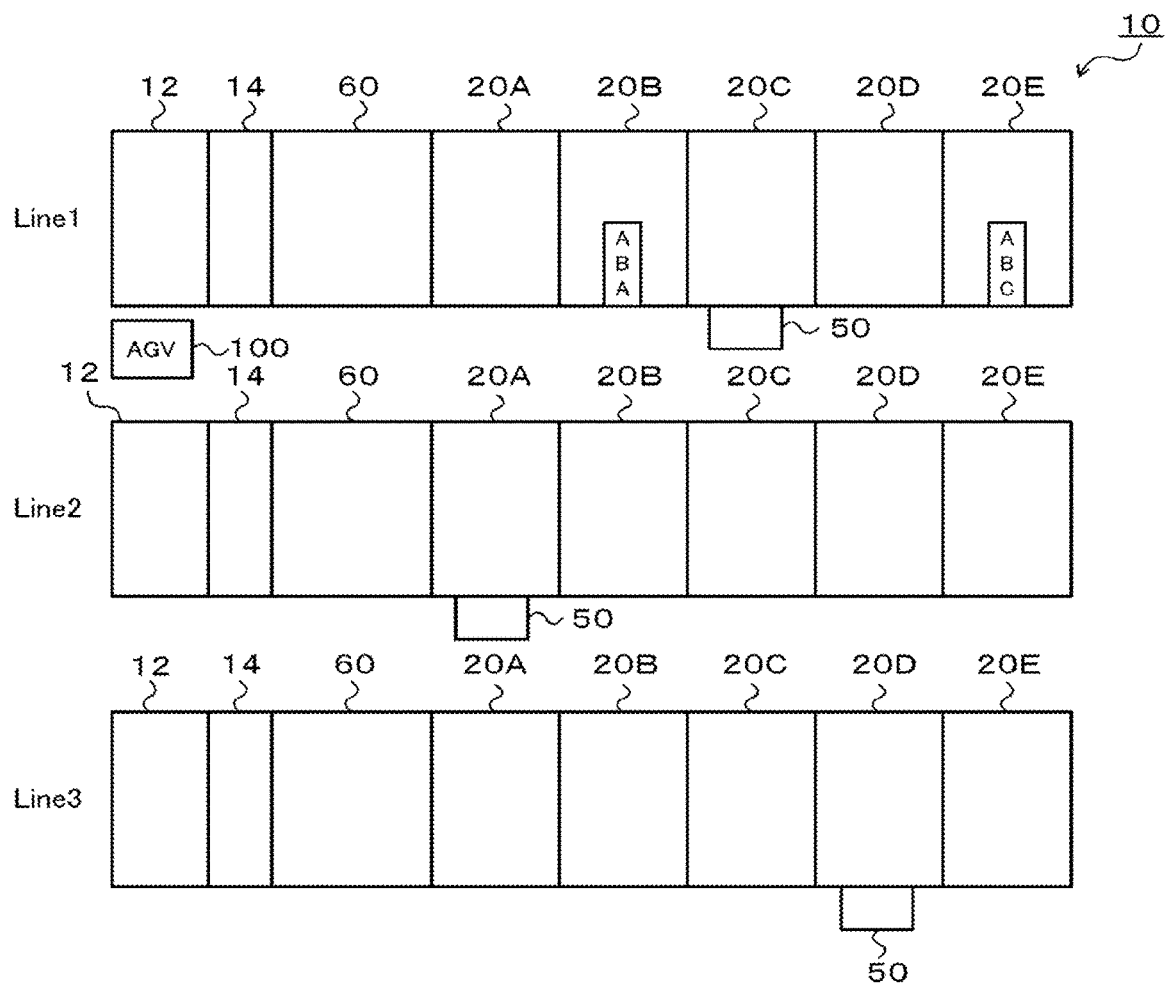
FIG. 16 is an explanatory diagram illustrating a state of collecting and conveying in-process feeders ABA and ABC.
Figure 17:
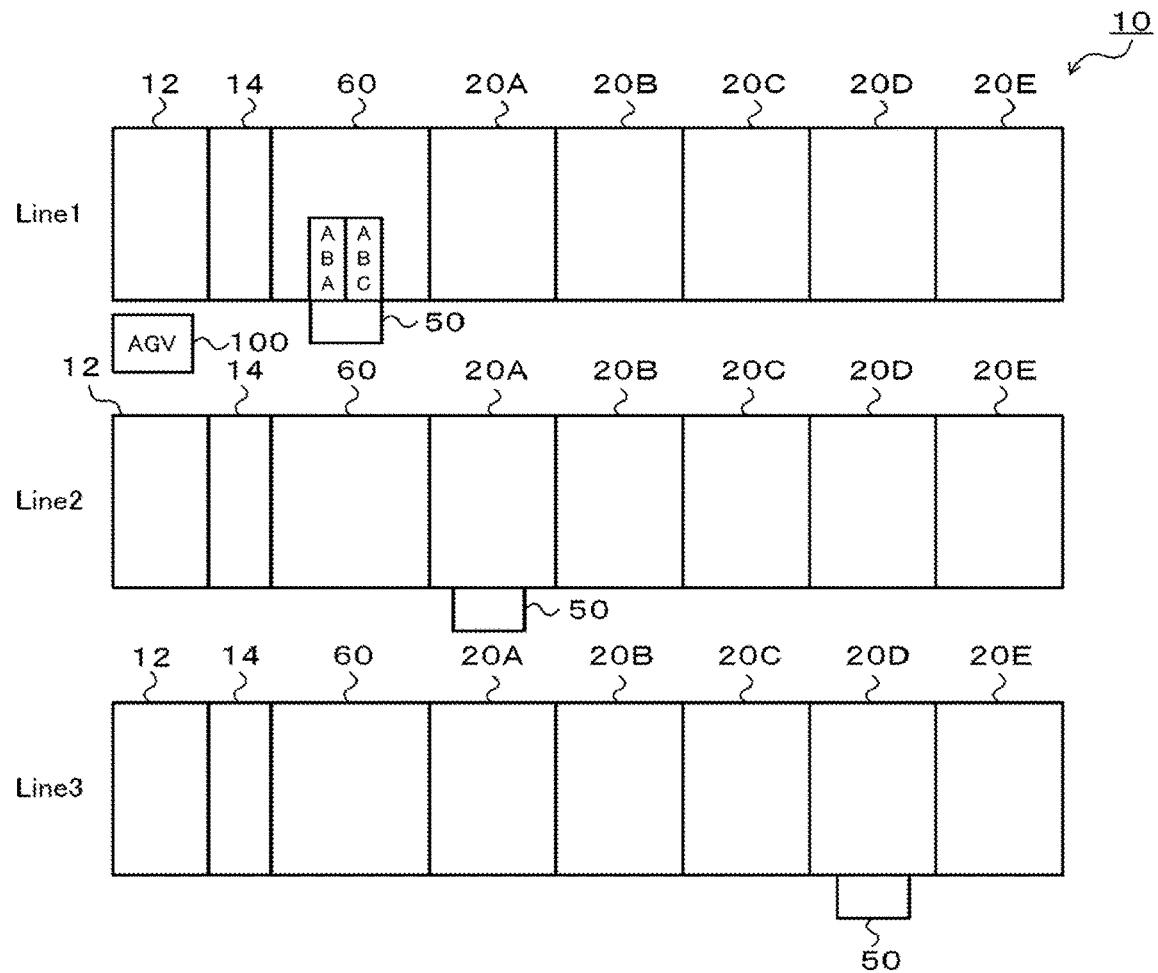
FIG. 17 is an explanatory diagram illustrating a state of collecting and conveying in-process feeders ABA and ABC.

FIGS. 16 to 19 are explanatory diagrams illustrating the state of collecting and conveying in-process feeders ABA and ABC. Now, a case is considered, where the production of a predetermined board is ended in line 1 and the feeder was used in line 1, but there are in-process feeders ABA and ABC scheduled to be used in other lines. Here, as illustrated in FIG. 16, in-process feeder ABA is a feeder that was used in component mounter 20B of line 1 and is scheduled to be used in the next production in component mounter 20C of line 2. In-process feeder ABC is a feeder that was used in component mounter 20E of line 1 and is scheduled to be used in the next production of component mounter 20A of line 3. As illustrated in FIGS. 16 and 17, feeder exchange robot 50 of line 1 collects in-process feeders ABA and ABC from component mounters 20B and 20E, respectively, and accommodates the feeders into feeder storage 60 of line 1. When in-process feeders ABA and ABC are accommodated into feeder storage 60, feeder exchange robot 50 of line 1 is separated from feeder storage 60 such that AGV 100 can collect in-process feeders ABA and ABC from feeder storage 60. As illustrated in FIG. 17, after feeder exchange robot 50 of line 1 is separated from feeder storage 60 of line 1, AGV 100 moves to the front of feeder storage 60 and collects in-process feeders ABA and ABC from feeder storage 60. Then, AGV 100 accommodates the collected in-process feeder ABA into feeder storage 60 of line 2.

Figure 18:
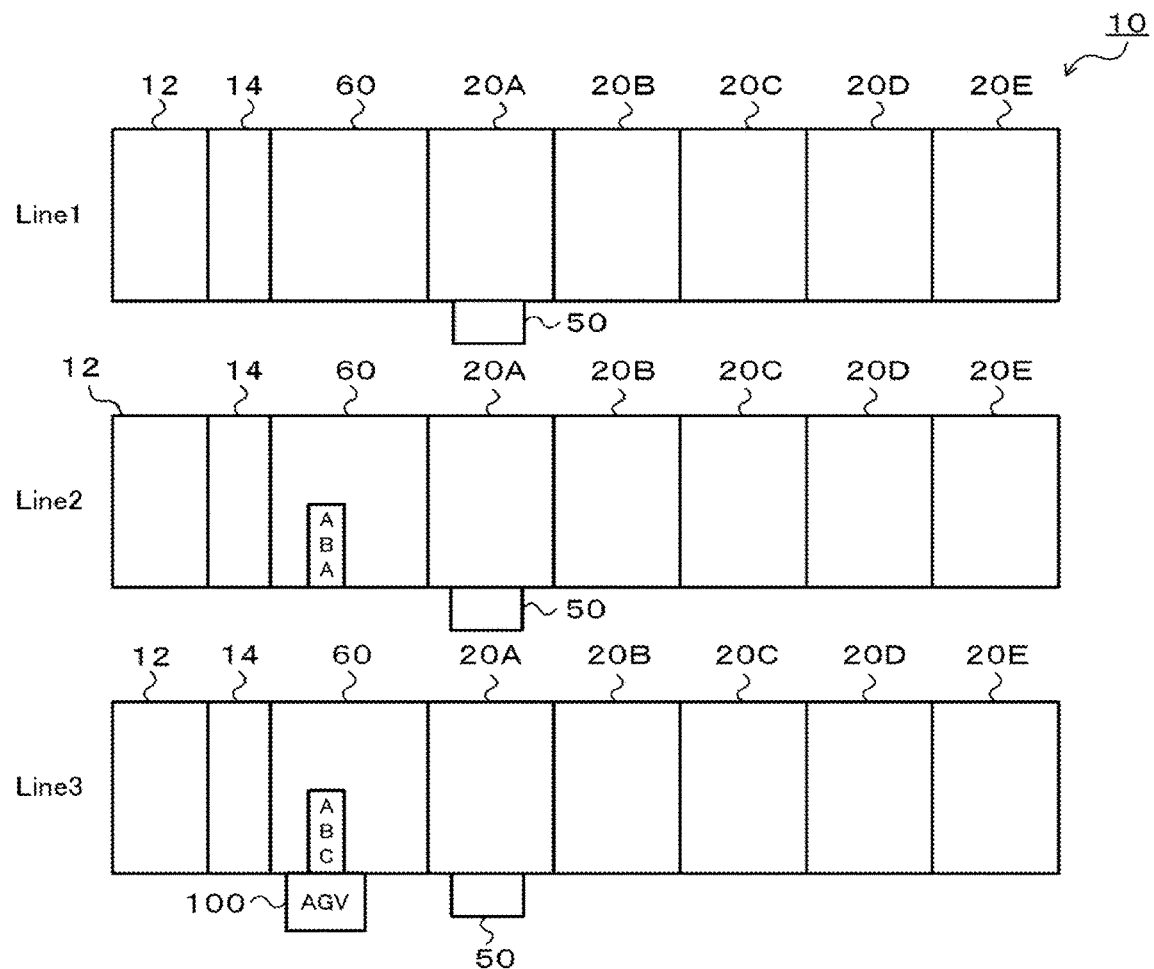
FIG. 18 is an explanatory diagram illustrating a state of collecting and conveying in-process feeders ABA and ABC.
Figure 19:
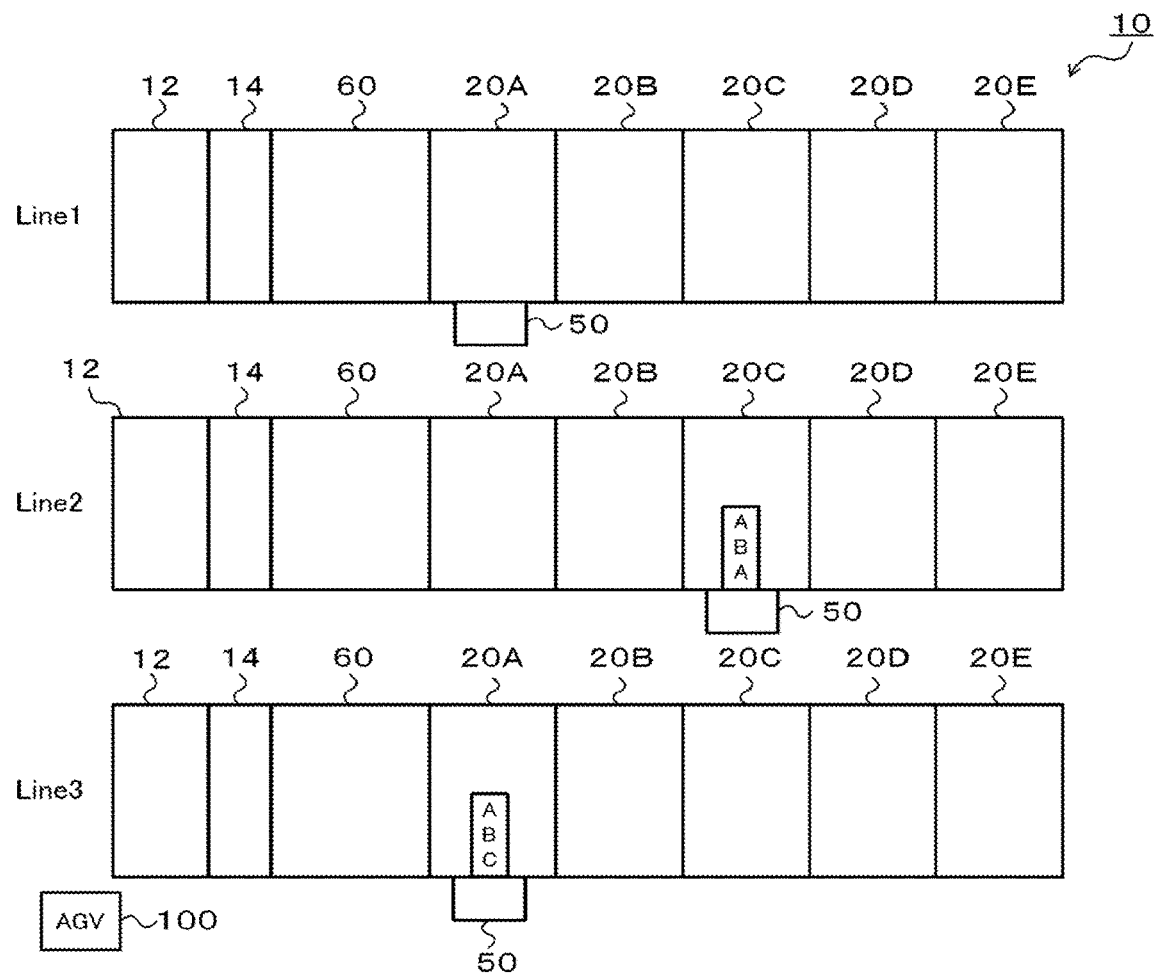
FIG. 19 is an explanatory diagram illustrating a state of collecting and conveying in-process feeders ABA and ABC.

Subsequently, as illustrated in FIG. 18, AGV 100 accommodates the collected in-process feeder ABC into feeder storage 60 of line 3. As illustrated in FIG. 19, feeder exchange robot 50 of line 2 collects in-process feeder ABA from feeder storage 60 of line 2 during the preparatory period for the next production of line 2, and causes the in-process feeder to be loaded to feeder base 40 (component supply area) at the upper stage of component mounter 20C of line 2 that requires in-process feeder ABA (loaded component). In addition, feeder exchange robot 50 of line 3 collects in-process feeder ABC from feeder storage 60 of line 3 during the preparatory period for the next production of line 3, and causes the in-process feeder to be loaded to feeder base 40 at the upper stage of component mounter 20A of line 3 (component supply area) that requires in-process feeder ABC (loaded component).

Here, the correspondence relationship between the configuration elements in the present embodiment and the configuration elements in the present disclosure will be described. That is, component mounting line 10 (lines 1 to 3) in the embodiment corresponds to the component mounting lines in the present disclosure, component mounter 20 (20A to 20E) corresponds to the component mounter, feeder storage 60 corresponds to the feeder storage, feeder exchange robot 50 corresponds to a feeder exchange device, and HDD 83 of management device 80 corresponds to a memory device. In addition, automatic guided vehicle (AGV) 100 corresponds to an automatic conveyance device.

It goes without saying that the present disclosure is not limited to the embodiment described above, and can be implemented in various aspects as long as it belongs to the technical scope of the present disclosure.

For example, in the embodiment described above, when there are multiple in-process feeders that load the components of the same component type, AGV control device 109 conveys the in-process feeder having the shorter life of the component to feeder storage 60 of the line requiring the in-process feeder. In addition, when the life of the component is the same, AGV control device 109 conveys the in-process feeder having the smaller remaining number of components to feeder storage 60 of the line requiring the in-process feeder. However, without considering the life of the components, AGV control device 109 may convey the in-process feeder having the smaller remaining number of components to feeder storage 60 of the line scheduled to be used. In addition, without considering the life of the component or remaining number of components, AGV control device 109 may convey the in-process feeder to feeder storage 60 of the line requiring the in-process feeder.

In the embodiment described above, component mounting system 1 conveys the in-process feeder by moving the in-process feeder between the lines using automatic guided vehicle (AGV) 100. However, component mounting system 1 may convey the in-process feeder by moving the in-process feeder between the lines using overhead hoist transport (OHT). In addition, the operator may convey the in-process feeder without using such an automatic guided vehicle (AGV or OHT). In this case, the instruction for conveyance may be made by notifying a display screen of a mobile terminal carried by the operator or display 86 included in management device 80 of the location and the conveyance destination of the in-process feeder.

As described above, component mounting system (1) according to the present disclosure includes: multiple component mounting lines (10) where multiple component mounters (20, 20A to 20E) that can mount components supplied from feeder (30) on a board and feeder storage (60) are aligned along a board conveyance direction; feeder exchange device (50) that is provided on each of multiple component mounting lines (10) and moves along the board conveyance direction to exchange feeder (30) between component mounter (20) and feeder storage (60) of component mounting line (10) in charge; and memory device (83) that store production information including a type of board used for production for each component mounting line (10), a type of component to be mounted on the board, and an order of production, and stores feeder information including identification information of feeder (30), a location of feeder (30), and a type of component to be loaded on feeder (30). When it is determined that there is the in-process feeder that was used in component mounting line (10) in charge and is scheduled to be used in another component mounting line (10) based on the production information and the feeder information, feeder exchange device (50) stores the in-process feeder in feeder storage (60) of component mounting line (10) in charge.

The component mounting system in the present disclosure is provided with the feeder exchange device in each of the multiple component mounting lines where multiple component mounters and feeder storage machines are aligned in the board conveyance direction. When it is determined, based on the production information (production plan, production schedule, number of feeders to be used and necessary component information) and the feeder information (storage area information), that there is an in-process feeder that was used in the component mounting line in charge and scheduled to be used in another component mounting line, the feeder exchange device stores the in-process feeder in the feeder storage of the component mounting line in charge. In this way, since the in-process feeders can be collected from the feeder storage collectively, it becomes possible to change the setup of each component mounting line (production preparation) more efficiently.

In addition, the component mounting system in the present embodiment may further includes automatic conveyance device (100) that moves between the lines of multiple component mounting lines (10) and transport feeder (30) from feeder storage (60) of one component mounting line (10) to feeder storage (60) of another component mounting line (10). When it is determined that there is the in-process feeder in feeder storage (60) of any component mounting line (10) among multiple component mounting lines (10) based on the production information and the feeder information, automatic conveyance device (100) may transport the in-process feeder to feeder storage (60) of the other component mounting line (10) schedule to use the in-process feeder. In this way, the components can be efficiently used for production (mounted on the board), and thus, it is possible to suppress the occurrence of wasteful components.

Furthermore, in the component mounting system in the present embodiment, memory device (83) may store an expiration date of the component to be loaded on feeder (30), and when it is determined that there are the same type of multiple in-process feeders that loads the same type of components, automatic conveyance device (100) may preferentially transport the in-process feeder having a shorter expiration date to feeder storage (60) of other component mounting line (10). In this way, it is possible to suppress the occurrence of the feeder with the components of which the expiration date is expired, and avoid the unnecessary disposal of the components.

In addition, in the component mounting system in the present embodiment, memory device (83) may store a remaining number of components to be loaded on feeder (30), and when it is determined that there are the same type of multiple in-process feeders that loads the same type of components, automatic conveyance device (100) may preferentially transport the in-process feeder having a smaller remaining number of components to feeder storage (60) of other component mounting line (10). In this way, it is possible to suppress the production efficiency from deteriorating due to the large amount of feeders currently being in use.

In addition, in the component mounting system in the present embodiment, automatic conveyance device (100) may preferentially transport the in-process feeder that is in component mounting line (10) to feeder storage (60) of the other component mounting line (10). In this case, automatic conveyance device (100) may convey new feeder (30) that loads the required component to feeder storage (60) of corresponding component mounting line (10) when it is determined that there is not the in-process feeder that loads the required components necessary for the next production in any component mounting line (10) among multiple component mounting lines (10). In this way, by using the feeder currently being in use as much as possible, it is possible to suppress the work of taking out a new feeder from the warehouse and reduce the burden on the operator.

INDUSTRIAL APPLICABILITY

The present disclosure can be used in the manufacturing industry of component mounting systems and the like.

REFERENCE SIGNS LIST 1 component mounting system, 10 component mounting line, 12 printer, 14 printing inspector, 16 X-axis rail, 20, 20A-20E component mounter, 23 board conveyance device, 24 head, 25 head moving device, 26 mark camera, 27 part camera, 28 nozzle station, 29 mounting control device, 30 feeder, 32 tape reel, 33 tape feeding mechanism, 34 positioning pin, 35 connector, 37 rail member, 39 feeder control device, 40,41 feeder base, 42 slot, 44 positioning hole, 45 connector, 50 feeder exchange robot, 51 robot moving mechanism, 52a X-axis motor, 52b guide roller, 53 feeder transfer mechanism, 54 clamp section, 55 Y-axis slider, 55a Y-axis motor, 55b Y-axis guide rail, 56 Z-axis guide rail, 56a Z-axis motor, 57 encoder, 58 monitoring sensor, 59 robot control device, 60 feeder storage, 62 board conveyance device, 80 management device, 81 CPU, 82 ROM, 83 HDD, 84 RAM, 85 input device, 86 display, 100 automatic guided vehicle (AGV), 101 AGV moving mechanism, 103 feeder transfer mechanism, 104 clamp section, 105 Y-axis slider, 105a Y-axis motor, 105b Y-axis guide rail, 107 position sensor, 108 monitoring sensor, S board

The invention claimed is:

1. A component mounting system comprising:
multiple component mounting lines where multiple component mounters that can mount components supplied from a feeder on a board and a feeder storage are aligned along a board conveyance direction;
a feeder exchange device that is provided on each of the multiple component mounting lines and configured to move along the board conveyance direction to exchange the feeder between the component mounter and the feeder storage of the component mounting line in charge;
an automatic conveyance device configured to move between the lines of the multiple component mounting lines and transport the feeder from the feeder storage of one component mounting line to the feeder storage of another component mounting line;
a memory device configured to store production information including a type of board used for production for each component mounting line, a type of component to be mounted on the board, and an order of production, and store feeder information including identification information of the feeder, a location of the feeder, and a type of component to be loaded on the feeder, wherein the memory device is configured to store an expiration date of the component to be loaded on the feeder; and
an electronic control device configured to
determine, based on the production information and the feeder information, whether there is an in-process feeder that was used in a first component mounting line of the multiple component lines and is scheduled to be used in a second component mounting line of the multiple component lines,
control the feeder exchange device to store the in-process feeder in the feeder storage of the first component mounting line in charge when it is determined that the in-process feeder that was used in the first component mounting line is scheduled to be used in a second component mounting line of the multiple component lines,
determine, based on the production information and the feeder information, whether the in-process feeder in the feeder storage of any component mounting line is among the multiple component mounting lines,
control the automatic conveyance device to transport the in-process feeder to the feeder storage of the second component mounting line schedule to use the in-process feeder when it is determined that the in-process feeder is in the feeder storage of any component mounting line among the multiple component mounting lines.

2. The component mounting system according to claim 1, wherein the memory device is configured to store an expiration date of the component to be loaded on the feeder, and the electronic control device is configured to control the automatic conveyance device to transport the in-process feeder having a shorter expiration date to the feeder storage of the second component mounting line when it is determined that there are the same type of multiple in-process feeders that loads the same type of components.

3. The component mounting system according to claim 1, wherein the memory device is configured to store a remaining number of components to be loaded on the feeder, and the electronic control device is configured to control the automatic conveyance device to transport the in-process feeder having a smaller remaining number of components to the feeder storage of the second component mounting line when it is determined that there are the same type of multiple in-process feeders that loads the same type of components.

4. The component mounting system according to claim 1, wherein the electronic control device is configured to control the automatic conveyance device to transport the in-process feeder that is in the component mounting line to the feeder storage of the second component mounting line.

5. The component mounting system according to claim 4, wherein the electronic control device is configured to determine whether there is not the in-process feeder that loads the required components necessary for the next production in any component mounting line among the multiple component mounting lines, and control the automatic conveyance device to convey a new feeder that loads a required component to the feeder storage of a corresponding component mounting line when it is determined that there is not the in-process feeder that loads the required components necessary for the next production in any component mounting line among the multiple component mounting lines.

\* \* \* \* \*